(12) United States Patent
Gilet et al.

(10) Patent No.: US 10,050,080 B2
(45) Date of Patent: Aug. 14, 2018

(54) OPTOELECTRONIC DEVICE AND METHOD FOR MANUFACTURING SAME

(71) Applicants: Commissariat a l'energie atomique et aux energies alternatives, Paris (FR); Aledia, Grenoble (FR)

(72) Inventors: Philippe Gilet, Teche (FR); Alexei Tchelnokov, Meylan (FR); Ivan Christophe Robin, Grenoble (FR)

(73) Assignees: Commissariat a l'energie atomique et aux energies alternatives, Paris (FR); Aledia, Grenoble (FR)

( * ) Notice: Subject to any disclaimer, the term of this patent is extended or adjusted under 35 U.S.C. 154(b) by 0 days.

(21) Appl. No.: 14/891,282

(22) PCT Filed: May 13, 2014

(86) PCT No.: PCT/FR2014/051110
§ 371 (c)(1),
(2) Date: Nov. 13, 2015

(87) PCT Pub. No.: WO2014/184486
PCT Pub. Date: Nov. 20, 2014

(65) Prior Publication Data
US 2016/0093666 A1    Mar. 31, 2016

(30) Foreign Application Priority Data
May 14, 2013    (FR) ...................................... 13 54286

(51) Int. Cl.
*H01L 27/15*    (2006.01)
*H01L 33/18*    (2010.01)
(Continued)

(52) U.S. Cl.
CPC ............... *H01L 27/15* (2013.01); *H01L 33/18* (2013.01); *H01L 33/32* (2013.01); *B82Y 20/00* (2013.01);
(Continued)

(58) Field of Classification Search
CPC ......... H01L 27/15; H01L 33/18; H01L 33/32; H01L 33/08; H01L 33/007; H01L 33/24; H01L 33/14; B82Y 20/00
See application file for complete search history.

(56) References Cited

U.S. PATENT DOCUMENTS 4,439,910 A * 4/1984 Vasudev .................. H01L 27/15
257/79
5,283,447 A * 2/1994 Olbright .................. H01L 27/15
257/197
(Continued)

FOREIGN PATENT DOCUMENTS

EP    0544512 A1    6/1993
EP    0803948 A2 *    10/1997 ......... H01L 33/0016
(Continued)

OTHER PUBLICATIONS

"International Search Report"; issued in International Application No. PCT/FR2014/051111; dated Jul. 28, 2014 by the EPO as International Searching Authority.
(Continued)

*Primary Examiner* — Steven Loke
*Assistant Examiner* — Juanita Rhodes
(74) *Attorney, Agent, or Firm* — Kaplan Breyer Schwarz, LLP

(57) ABSTRACT

The invention relates to an optoelectronic device (50) including: a semiconductor substrate (14) doped with a first conductivity type; semiconductor contact pads (54) or a semiconductor layer, in contact with a surface of the sub-
(Continued)

strate, doped with a second conductivity type opposite to the first type; conical or frusto-conical wired semiconductor elements (26), doped with the first conductivity type, each element being in contact with one of the contact pads or with the layer; light-emitting semiconductor portions (30), each portion at least partially covering one of the semiconductor elements; and a circuit (S) for polarizing the contact pads (54) or the layer. The contact pads or the layer are selected among: aluminum nitride, boron nitride, silicon carbide, magnesium nitride, gallium and magnesium nitride, or a combination of same and the nitride compounds thereof.

10 Claims, 3 Drawing Sheets

(51) Int. Cl.
| | | |
|---|---|---|
| *H01L 33/32* | (2010.01) | |
| *H01L 33/08* | (2010.01) | |
| *H01L 33/00* | (2010.01) | |
| *H01L 33/14* | (2010.01) | |
| *B82Y 20/00* | (2011.01) | |
| *H01L 33/24* | (2010.01) | |

(52) U.S. Cl.
CPC ............ *H01L 33/007* (2013.01); *H01L 33/08* (2013.01); *H01L 33/14* (2013.01); *H01L 33/24* (2013.01)

(56) References Cited

U.S. PATENT DOCUMENTS

| | | | |
|---|---|---|---|
| 7,598,544 B2 | 10/2009 | Bertin et al. | |
| 7,994,527 B2 | 8/2011 | DenBaars et al. | |
| 8,183,587 B2 | 5/2012 | Sameulson et al. | |
| 8,357,921 B2 | 1/2013 | Bertin | |
| 9,537,050 B2 | 1/2017 | Gilet et al. | |
| 2003/0123829 A1 | 7/2003 | Taylor | |
| 2004/0089898 A1 | 5/2004 | Ruhnau et al. | |
| 2004/0200523 A1* | 10/2004 | King | H01L 31/036 136/262 |
| 2006/0289891 A1 | 12/2006 | Hutchins | |
| 2009/0230422 A1* | 9/2009 | Katsuno | H01L 33/32 257/99 |
| 2010/0276664 A1* | 11/2010 | Hersee | B82Y 20/00 257/15 |
| 2010/0320462 A1* | 12/2010 | Koukitu | C30B 25/02 257/49 |
| 2011/0005570 A1 | 1/2011 | Jain | |
| 2011/0140072 A1* | 6/2011 | Varangis | B82Y 20/00 257/9 |
| 2011/0227037 A1 | 9/2011 | Su | |
| 2012/0001303 A1 | 1/2012 | Huang et al. | |
| 2012/0061646 A1* | 3/2012 | Yi | H01L 33/24 257/13 |
| 2012/0068153 A1* | 3/2012 | Seong | H01L 33/16 257/13 |
| 2012/0074385 A1* | 3/2012 | Tak | H01L 21/02381 257/15 |
| 2016/0126416 A1 | 5/2016 | Gilet et al. | |
| 2016/0149075 A1 | 5/2016 | Atanackovic | |

FOREIGN PATENT DOCUMENTS

| | | |
|---|---|---|
| WO | 0045443 A1 | 8/2000 |
| WO | 2009072631 A1 | 11/2009 |
| WO | 2012136665 A1 | 10/2012 |

OTHER PUBLICATIONS

"International Search Report"; issued in International Application No. PCT/FR2014/051110; dated Aug. 11, 2014 by the EPO as International Searching Authority.

Chen, et al, "Homoepitaxial growth of catalyst-free GaN wires on N-polar substrates", "Applied Physics Letters", Oct. 13, 2010, pp. 151909-1-151909-3, vol. 97, No. 151909, Publisher: American Institute of Physics; doi: 10.1063/1.3497078; XP-12137241.

Krames, et al., "High-power truncated-inverted-pyramid (AlxGa1-x)0.5In0.5P/GaP light-emitting diodes exhibiting >50% external quantum efficiency", "Applied Physics Letters", Oct. 18, 1999, pp. 2365-2367, vol. 75, No. 16, Publisher: American Institute of Physics; XP-12023753A.

"Notice of Allowance" dated Aug. 3, 2016 issued in related U.S. Appl. No. 14/891,258, Publisher: USPTO, Published in: US.

"Written Opinion" issued in counterpart International Application No. PCT/FR2014/051110, dated Nov. 14, 2015.

"Written Opinion" issued in International Application No. PCT/FR2014/051111, dated Nov. 14, 2015 (Counterpart to related U.S. Appl. No. 14/891,258).

"Corrected Notice of Allowability" dated Nov. 3, 2016 in related U.S. Appl. No. 14/891,258.

"Interview Summary" dated Oct. 25, 2016 in related U.S. Appl. No. 14/891,258.

\* cited by examiner

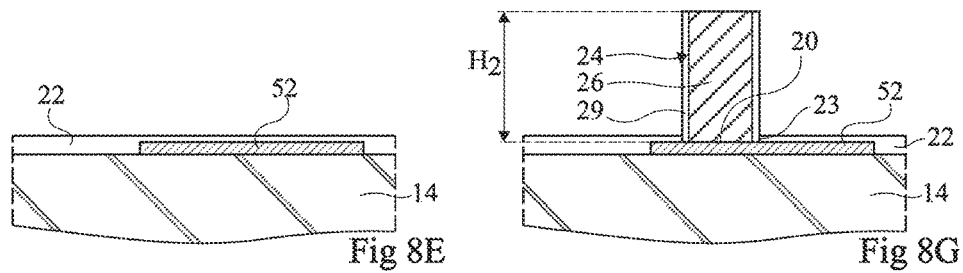
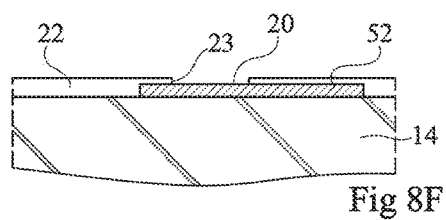
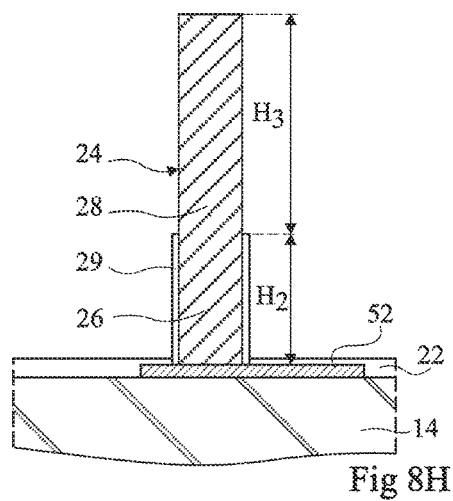
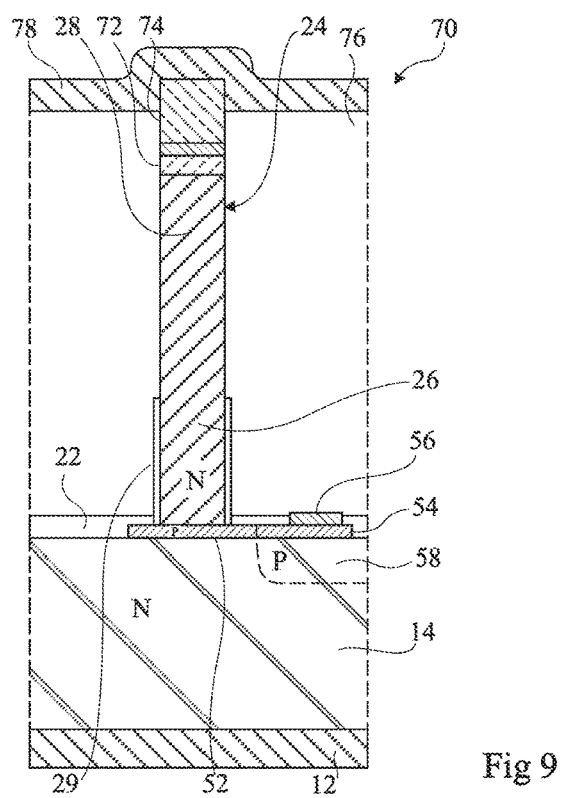

OPTOELECTRONIC DEVICE AND METHOD FOR MANUFACTURING SAME

The present patent application claims the priority benefit of French patent application FR13/54286 which is herein incorporated by reference.

BACKGROUND

The present invention generally relates to semiconductor materials, to devices based on semiconductor materials, and to the manufacturing methods thereof. The present invention more specifically relates to devices comprising three-dimensional elements, and especially semiconductor microwires or nanowires.

DISCUSSION OF THE RELATED ART

Microwires or nanowires based on a component mainly containing a group-III element and a group-V element (for example, gallium nitride GaN), called III-V compound hereafter, or mainly containing a group-II element and a group-VI element (for example, zinc oxide ZnO), called II-VI compound hereafter, are examples of microwires or nanowires comprising a semiconductor material. Such microwires or nanowires enable to manufacture semiconductor devices such as optoelectronic devices.

Term "optoelectronic devices" is used to designate devices capable of converting an electric signal into an electromagnetic radiation or conversely, and particularly devices dedicated to detecting, measuring, or emitting an electromagnetic radiation.

SUMMARY

Thus, an embodiment provides an optoelectronic device comprising:

a doped semiconductor substrate of a first conductivity type;

pads or a layer, on a surface of the substrate, doped with a second conductivity type opposite to the first type;

wire-shaped, conical, or tapered semiconductor elements, doped with the first conductivity type, each element resting on one of the pads or on the layer;

light-emitting semiconductor portions, each portion at least partially covering one of the semiconductor elements; and a circuit for biasing the pads or the layer.

According to an embodiment, the device further comprises a circuit for biasing the semiconductor portions.

According to an embodiment, the dopant concentration of the pads or of the layer is in the range from $10^{15}$ atoms/cm$^3$ to $10^{19}$ atoms/cm$^3$.

According to an embodiment, the dopant concentration of the substrate is in the range from $10^{16}$ atoms/cm$^3$ to $10^{21}$ atoms/cm$^3$.

According to an embodiment, the dopant concentration of the substrate is in the range from $10^{16}$ atoms/cm$^3$ to $10^{21}$ atoms/cm$^3$.

According to an embodiment, the thickness of each pad or of the layer is in the range from 1 nm to 1 μm.

According to an embodiment, the substrate is made of a semiconductor material selected from the group comprising silicon, germanium, silicon carbide, a III-V compound, a II-VI compound, and a combination of these compounds.

According to an embodiment, each element mainly comprises a semiconductor material selected from the group comprising a III-V compound, a II-VI compound, and a combination of these compounds.

According to an embodiment, the pads or the layer are made of a material selected from the group comprising aluminum nitride, boron nitride, silicon carbide, magnesium nitride, magnesium gallium nitride, or of a combination thereof and of their nitrided compounds.

According to an embodiment, each semiconductor element is a microwire or a nanowire.

According to an embodiment, each semiconductor element is at least partially covered with a semiconductor structure capable of emitting light.

An embodiment provides a method of manufacturing an optoelectronic device, comprising the successive steps of:

providing a doped semiconductor substrate of a first conductivity type;

forming, on a surface of the substrate, a layer or pads, doped with a second conductivity type opposite to the first type;

forming wire-shaped, conical, or tapered semiconductor elements, doped with the first conductivity type, each semiconductor element resting on one of the pads or on the layer;

forming light-emitting semiconductor portions, each portion at least partially covering one of the semiconductor elements; and providing a circuit for biasing the pads or the layer.

BRIEF DESCRIPTION OF THE DRAWINGS

The foregoing and other features and advantages will be discussed in detail in the following non-limiting description of specific embodiments in connection with the accompanying drawings, among which:

FIGS. 8A to 8H are partial simplified cross-section views of the structures obtained at successive steps of another embodiment of a method of manufacturing the optoelectronic device of FIG. 5; and FIG. 9 is a partial simplified cross-section view of another embodiment of an optoelectronic device comprising microwires or nanowires.

DETAILED DESCRIPTION

Figure 1:
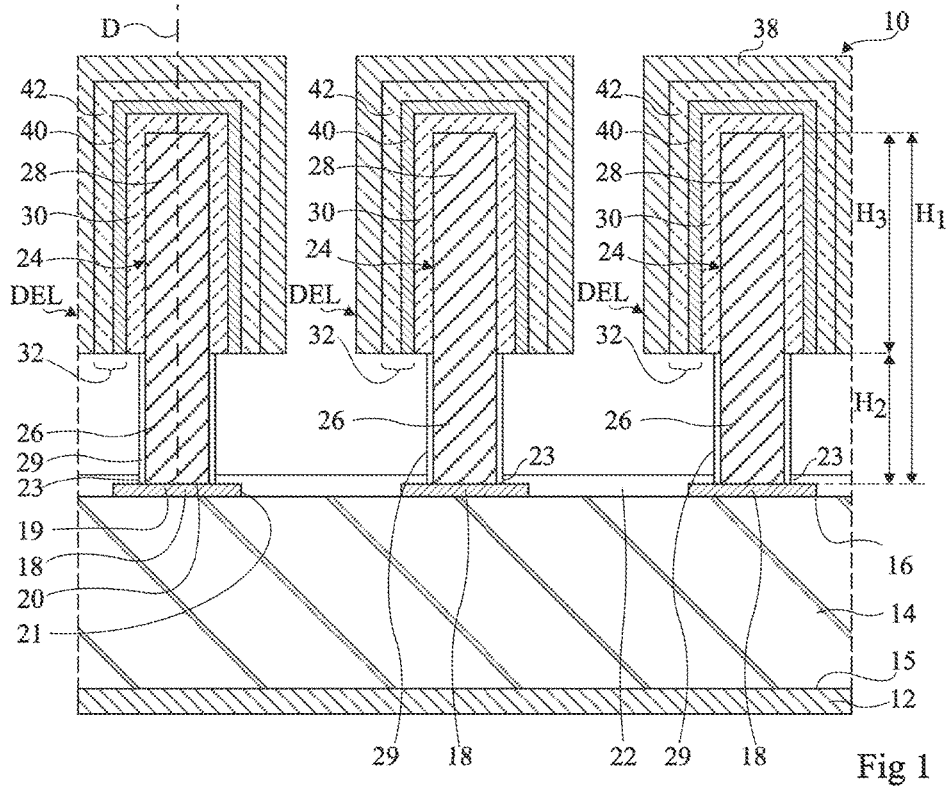
FIG. 1 is a partial simplified cross-section view of an example of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present invention relates to the manufacturing of three-dimensional elements, for example, microwires, nanowires, or elements having a conical shape, particularly a pyramidal cone, or a tapered shape. In the following description, embodiments are described for the manufacturing of microwires or nanowires. However, these embodiments may be implemented for the manufacturing of three-dimensional elements other than microwires or nanowires, for example, for the manufacturing of three-dimensional elements having a conical shape, particularly a pyramid shape, or a tapered shape.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The wires may at least partly be formed based on at least one semiconductor material. The semiconductor material may be silicon, germanium, silicon carbide, a III-V compound, a II-VI compound, or a combination of these compounds.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The wires may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

A seed layer or pads or islands, also called seed islands hereafter, are formed on a surface of a substrate. The seed layer or the seed islands are made of a material favoring the wire growth. In the case of seed islands, a treatment is further provided to protect the lateral sides of the seed islands and the surface of the substrate portions which are not covered with the seed islands to prevent the growth of wires on the lateral sides of the seed islands and on the surface of the substrate portions which are not covered with the seed islands. The treatment may comprise forming a dielectric region on the lateral sides of the seed islands and extending on top of and/or inside of the substrate and connecting, for each pair of islands, one of the islands in the pair to the other islands in the pair, with no wire growth on the dielectric region.

The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, of a II-VI compound such as ZnO, or of a combination of these compounds. The substrate may be made of single-crystal silicon.

The fact of saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or the atoms of the second element in the case of the polarity of the second element.

The material forming the seed layer or the seed islands is selected to favor the wire growth according to the same polarity. As an example, when the wires mainly comprise a III-V compound, the material forming the seed islands is preferably selected to favor the growth of the III-V compound according to the polarity of the group-V element. The III-V compound then grows according to the polarity of the group-V element on the seed islands, from the top of each seed island, and grows neither on the lateral sides of the seed islands nor on the rest of the substrate. Further, the inventors have shown that each wire then grows according to a substantially constant polarity in the entire wire. When the wires mainly comprise a II-VI compound, the material forming the seed islands is preferably selected to promote the growth of the II-VI compound according to the polarity of the group-VI element. The II-VI compound then grows according to the polarity of the group-VI element on the seed islands, from the top of each seed island, and grows neither on the lateral sides of the seed islands nor on the rest of the substrate.

In the case of a III-V compound where the group-V element is nitrogen, the material forming the islands may be a material favoring the growth of a wire according to the N polarity. As an example, the islands may be made of aluminum nitride (AlN), of boron nitride (BN), of silicon carbide (SiC), of magnesium nitride in $Mg_xN_y$ form, where x is approximately equal to 3 and y is approximately equal to 2, for example magnesium nitride in $Mg_3N_2$ form or gallium and magnesium nitride (MgGaN), or of a combination thereof and of the nitrided compounds thereof. Preferably, the material forming the seed islands is aluminum nitride.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane ($SiH_4$).

FIG. 1 is a partial simplified cross-section view of an example of an optoelectronic device 10 formed from wires such as previously described and capable of emitting an electromagnetic radiation.

Device 10 comprises, from bottom to top in FIG. 1:
a first biasing electrode 12;
a semiconductor substrate 14 comprising opposite surfaces 15 and 16, surface 15 being in contact with electrode 12;
seed islands 18 favoring the growth of wires and arranged on surface 16, each island 18 comprising a lower surface 19 in contact with surface 16 of substrate 14, an upper surface 20, opposite to surface 19, and at a distance from surface 19, and lateral surfaces 21, or lateral sides, connecting lower surface 19 to upper surface 20;
an insulating layer 22 extending between seed islands 18 on surface 16 of substrate 14, insulating layer 22 partially covering each seed island 18 and comprising openings 23 which each expose a portion of top 20 of one of seed islands 18;
wires 24 (three wires being shown) of height $H_1$, each wire 24 being in contact with surface 20 of one of islands 18, each wire 24 comprising a lower portion 26, of height $H_2$, in contact with island 18 and an upper portion 28, of height $H_3$, in contact with lower portion 26;
a passivating layer 29 covering the periphery of each lower portion 26;
an active layer 30 covering each upper portion 28;
a semiconductor layer 32 or a stack of semiconductor layers covering each active layer 30; and
a second electrode layer 38 covering each semiconductor layer 32.

The assembly formed of each wire 24 and the stack of active layer 30, of semiconductor layers 32, and of electrode 38 forms a light-emitting diode DEL.

Substrate 14 for example is a semiconductor substrate, such as a silicon substrate. Substrate 14 is doped with a first conductivity type, for example, N-type doped. Surfaces 15 and 16 may be planar and parallel. Surface 16 of substrate 14 may be a <100> surface.

Electrode 12 may correspond to a conductive layer which extends on surface 15 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Islands 18 are located on surface 16 so that they protrude from surface 16. Top 20 of each island 18 is thus in a different plane than surface 16. Each island 18 has a preferred texturing and, when the material forming each island comprises an alloy of at least two elements, a preferred polarity. Preferred texturing means that the crystals forming islands 18 have a preferred growth direction, which is the same for all islands 18. Preferred polarity means that islands 18 all substantially have the same polarity. This means that when the material forming each island comprises an alloy of at least two elements, when the material is cut in a plane perpendicular to the preferred growth direction of the material, the exposed surface essentially comprises atoms of the same element for each island 18. Each island 18 has the same conductivity type, for example, type N, as substrate 14 to decrease the interface resistance between islands 18 and substrate 14. Each island 18 may have any type of shape, for example rectangular, polygonal, circular, square, or oval.

Islands 18 for example have a thickness in the range from 1 to 100 nanometers, preferably from 1 to 60 nanometers, more preferably from 1 nm to 10 nm, more preferably still from 2 nm to 5 nm. The centers of two adjacent islands 18 may be distant by from 0.5 μm to 10 μm, and preferably by from 1.5 μm to 4 μm. As an example, islands 18 may be regularly distributed on substrate 14. As an example, islands 18 may be distributed in a hexagonal network.

Insulating layer 22 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. The thickness of insulating layer 22 is strictly greater than the thickness of seed islands 18. As an example, the thickness of insulating layer 22 is in the range from 5 nm to 500 nm, for example, equal to approximately 30 nm.

Each wire 24 has a semiconductor structure elongated along an axis D substantially perpendicular to surface 16. Each wire 24 may have a general elongated cylindrical shape with a hexagonal base. The average diameter of each wire 24 may be in the range from 50 nm to 2.5 μm and height $H_1$ of each wire 24 may be in the range from 250 nm to 50 •m.

Lower portion 26 of each wire 24 is mainly formed of the III-N compound, for example, gallium nitride, having a doping of the first conductivity type, for example, doped with silicon. The periphery of lower portion 26 is covered with dielectric layer 29, for example SiN, up to height $H_2$ from the end of lower portion 26 in contact with the associated island 18. Height $H_2$ may be in the range from 100 nm to 25 μm. Dielectric material layer 29 has a thickness between one atomic monolayer and 100 nm, preferably between one atomic monolayer and 10 nm.

Upper portion 28 of each wire 24 is for example at least partly made of a III-N compound, for example, GaN. Upper portion 28 may have a doping of the first conductivity type, or may not be intentionally doped. Upper portion 28 extends up to height $H_3$ which may be in the range from 100 nm to 25 μm.

In the case of a wire mainly made of GaN, the crystal structure of the wire may be of wurtzite type, the wire extending along axis C. The crystal structure of the wire may also be of cubic type.

Active layer 30 is the layer from which most of the radiation provided by device 10 is emitted. According to an example, active layer 30 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

Semiconductor layer 32 or semiconductor layer stack 32 enables to form a P-N or P-I-N junction with active layer 30 and/or upper portion 28. It enables to inject holes into active layer 30 via electrode 38.

The stack of semiconductor layers 32 may comprise an electron barrier layer 40 formed of a ternary alloy, for example, made of aluminum gallium nitride (AlGaN) or of aluminum indium nitride (AlInN) in contact with active layer 30 and an additional layer 42, to provide a good electric contact between second electrode 38 and active layer 30, for example, made of gallium nitride (GaN) in contact with electronic barrier layer 40 and with electrode 38. Semiconductor layer 42 is doped with the conductivity type opposite to that of portion 28, for example, P-type doped. Electron barrier layer 40 may be of the same conductivity type as semiconductor layer 42.

Second electrode 38 is capable of biasing active layer 30 of each wire 24 and of letting through the electromagnetic radiation emitted by wires 24. The material forming electrode 38 may be a transparent and conductive material such as indium-tin oxide (or ITO), aluminum zinc oxide, or graphene.

In the present example, wires 24 are formed on islands 18 which are separate elements distributed on substrate 14. As a variation, seed islands 18 may be replaced with a seed layer covering surface 16 of substrate 14. The seed layer may be covered with an insulating layer comprising openings which expose portions of the seed layer, the wires growing on the exposed portions of the seed layer.

Seed islands 18, or the seed layer, should meet several constraints.

First, seed islands 18 or the seed layer should allow the growth of wires 24.

Second, seed islands 18 or the seed layer should prevent the diffusion of the group-III element, particularly gallium, from each wire 24 towards substrate 14. Indeed, the diffusion of the group-III element into substrate 14 would cause the creation of an alloy of silicon and of the group-III element which is prejudicial to the obtaining of materials of good quality for the forming of an optoelectronic device.

Third, seed islands 18 or the seed layer should allow the flowing of a current between each wire 24 and substrate 14 when electrodes 12 and 38 are properly biased. However, the materials currently used to form seed islands 18 or the seed layer generally have insulating properties. This is true for aluminum nitride (AlN). The thickness of each seed island 18 or of the seed layer should thus be sufficiently low for the electrons to be able to cross it by tunnel effect. For this purpose, the thickness of each seed island 18 or of the seed layer is generally lower than 2 nm.

Figure 2:
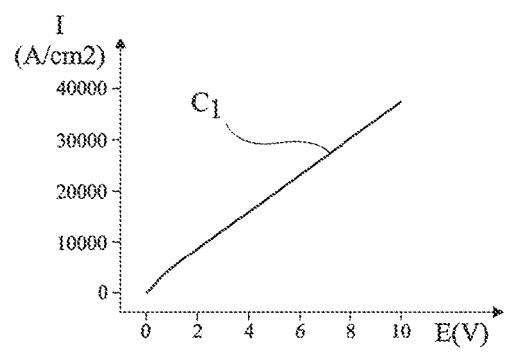
FIGS. 2 and 3 show curves of the variation of the intensity of the current flowing through each microwire or nanowire of the optoelectronic device of FIG. 1 according to the bias voltage between the device electrodes.

FIG. 2 shows a curve $C_1$ of the variation of the intensity of the current per surface area unit (A/cm$^2$) crossing seed islands 18 having a 1-nm thickness according to the voltage applied between electrodes 38 and 12. Curve $C_1$ has been obtained with an N-type doped silicon substrate 14 with a dopant concentration of $10^{19}$ atoms/cm$^3$, with N-type doped AlN seed islands at a dopant concentration of $10^{17}$ atoms/cm$^3$. Curve $C_1$ shows the flowing of a current through seed islands 18.

Figure 3:
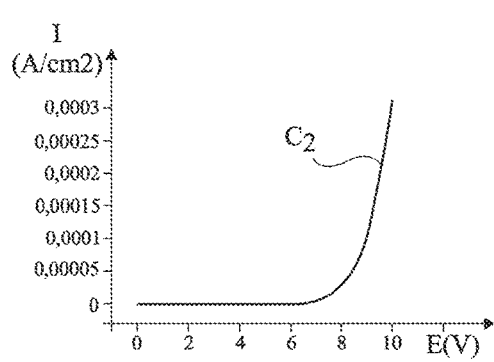

FIG. 3 shows a curve $C_2$ of the variation of the current intensity per surface area unit (A/cm$^2$) crossing seed islands 18, obtained for an optoelectronic device identical to that which has been used to obtain curve $C_1$ of FIG. 2, with the difference that the thickness of each seed island 18 is approximately 5 nm. As shown in FIG. 3, when the thickness of seed islands 18 is too large, no current flow can be observed through seed islands 18 for a bias voltage lower than 10 V.

The passing by tunnel effect of electrons through seed islands 18 is favored when substrate 14, seed islands 18, and lower portions 26 of wires 24 are heavily-doped at least at the interfaces between these regions. However, when seed islands 18 are made of AlN, aluminum may diffuse towards silicon substrate 14. Aluminum is a P-type dopant for silicon. Thereby, the diffusion of aluminum in substrate 14 tends to decrease the value of the N-type doping of substrate 14 at the interface between substrate 14 and seed islands 18. The improvement of the passing by tunnel effect of electrons through seed islands 18 due to the increase in N-type dopant concentrations is then not obtained.

Thus, an object of an embodiment is to overcome at least part of the disadvantages of optoelectronic devices, particularly comprising microwires or nanowires, and of their previously-described manufacturing methods.

Another object of an embodiment is to improve the current flow through each seed island or the seed layer.

Another object of an embodiment is that each three-dimensional element, especially each wire, made of semiconductor material, substantially has a single-crystal structure.

Another embodiment provides the possibility of accurately and uniformly controlling the position, the geometry, and the crystallographic properties of each three-dimensional element, especially of each wire, made of semiconductor material.

Another embodiment provides the possibility of forming the three-dimensional elements, and especially the wires, made of semiconductor material, at an industrial scale and at low cost.

According to an embodiment, it is provided to dope the semiconductor substrate and at least the lower portion of the wires with dopants of a first conductivity type, to dope the seed islands or the seed layer with dopants of a second conductivity type, opposite to the first conductivity type, and to connect the seed islands or the seed layer to a bias source, for example, a current or voltage source. Each seed island or the seed layer may play the role of the base of a bipolar transistor series-connected with each light-emitting diode.

An advantage is that the thickness of the seed islands or of the seed layer may be increased and that the dopant concentration of the seed islands or of the seed layer may be decreased.

Figure 4:
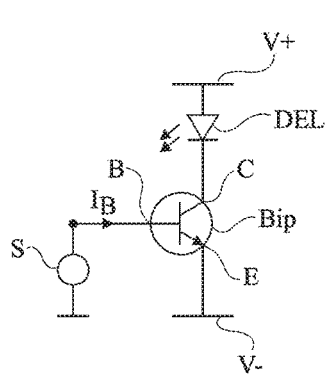
FIG. 4 shows an equivalent electric diagram of a portion of an embodiment of an optoelectronic device comprising microwires or nanowires.

FIG. 4 shows an equivalent electric diagram in operation associated with a light-emitting diode DEL of an embodiment of an optoelectronic device. Potential sources V+ and V− correspond to the potential sources intended to be connected, in operation, to electrodes 12 and 38. Collector C of transistor Bip is connected to the cathode of diode DEL, emitter E of transistor Bip is connected to voltage source V−, and base B is connected to a current source S. As a variation, the biasing of base B may be performed by any bias circuit, particularly by a voltage source in series with a resistor or by a voltage dividing bridge provided between potential sources V+ and V−.

In operation, base B of the transistor is preferably biased so that the bipolar transistor operates in saturation state. This advantageously enables to maximize the current flowing through diode DEL.

Figure 5:
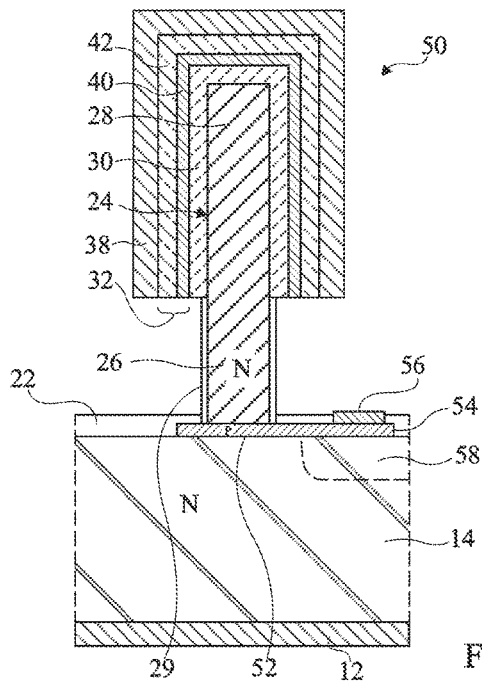
FIG. 5 is a partial simplified cross-section view of an embodiment of an optoelectronic device corresponding to the equivalent electric circuit of FIG. 4.

FIG. 5 is a partial simplified cross-section view of an embodiment according to the invention of an optoelectronic device 50 formed from wires such as previously described and capable of emitting an electromagnetic radiation and having its equivalent electric diagram associated with each wire shown in FIG. 4.

Optoelectronic device 50 comprises all the elements of optoelectronic device 10 previously described in relation with FIG. 1, with the difference that each seed island 18 of optoelectronic device 10, which has the same type of dopants as substrate 14 and lower portion 26 of wire 24, is replaced with a seed island 52 having a dopant type opposite to the dopant type of substrate 14 and of lower portion 26 of wire 24. Thereby, if substrate 14 and lower portion 26 are N-type doped, seed island 52 is P-type doped. The materials forming seed island 52 may be identical to those previously described for seed island 18.

As an example, the thickness of each seed island 52 is in the range from 1 nm to 1 µm, preferably from 1 to 500 nm, preferably from 10 nm to 200 nm, more preferably from 100 nm to 200 nm.

As an example, the dopant concentration of seed island 52 is in the range from $10^{15}$ to $10^{19}$ atoms/cm$^3$, preferably lower than $10^{18}$ atoms/cm$^3$. As an example, the dopant concentration of substrate 14 is in the range from $10^{17}$ to $10^{21}$ atoms/cm$^3$ and the dopant concentration of lower portion 26 of the wire is in the range from $10^{17}$ to $10^{21}$ atoms/cm$^3$.

Each seed island 52 may comprise a laterally-extending portion 54. A conductive pad 56 may be provided in contact with portion 54. Conductive pad 56 is intended to be connected to bias circuit S. A region 58 formed, for example, by proton implantation or by deep level doping, may be provided under portion 54 of seed island 52 to insulate it from the rest of substrate 14.

Substrate 14 corresponds to emitter E of bipolar transistor Bip, seed island 52 corresponds to base B of bipolar transistor Bip, and lower portion 26 of wire 24 corresponds to collector C of bipolar transistor Bip.

Figure 6:
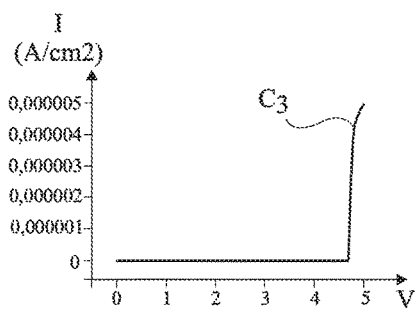
FIGS. 6 and 7 show curves of the variation of the intensity of the current flowing through each microwire or nanowire of the optoelectronic device of FIG. 5 according to the bias voltage between the device electrodes.

FIG. 6 shows a curve $C_3$ of the variation of the intensity of the current per surface area unit (A/cm$^2$) crossing each seed island 24 of optoelectronic device 50 according to the voltage applied between electrodes 38 and 12. Curve $C_3$ has been obtained with an N-type doped silicon substrate 14 with a dopant concentration of $10^{19}$ atoms/cm$^3$, with an N-type doped AlN seed island 52 having a 100-nm thickness and P-type doped with a dopant concentration of $10^{17}$ atoms/cm$^3$, and with an N-type doped lower portion 26 of wire 24 with a dopant concentration of $10^{18}$ atoms/cm$^3$. The base of the bipolar transistor was not supplied with current. Curve $C_3$ shows the absence of a current flow through seed islands 18 at least for voltages lower than 4 V.

Figure 7:
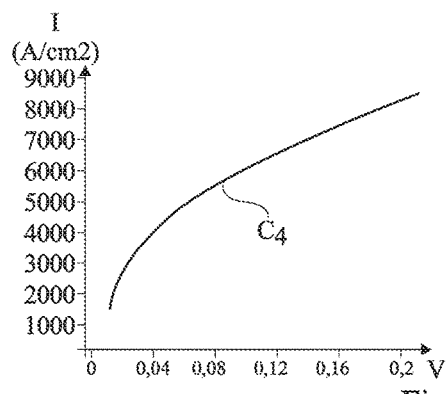

FIG. 7 shows a curve $C_4$ of the variation of the current intensity per surface area unit (A/cm$^2$) crossing seed islands 18, obtained for an optoelectronic device identical to that which has been used to obtain curve $C_3$ of FIG. 6, with the difference that base B was connected to the source of a 2.5-V voltage, so that the base current was in the order of 1 A/cm$^2$. As shown in FIG. 7, the flowing of a current through wire 24 has been observed as soon as a voltage greater than a few millivolts is applied between electrodes 38 and 12.

FIGS. 8A to 8H illustrate the structures obtained at successive steps of an embodiment of a method of manufacturing optoelectronic device 50 of FIG. 5.

Figure 8A:
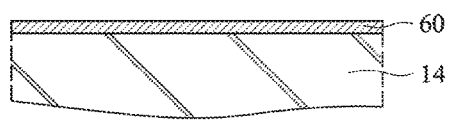

The embodiment of the manufacturing method according to the invention comprises the steps of:

(1) Depositing on substrate 14 a uniform layer 60 of the material favoring the growth of the III-N compound, for example according to the N polarity (FIG. 8A). It may be aluminum nitride. Layer 60 for example has a thickness in the range from 1 nm to 1 µm. Layer 60 may be obtained by a MOCVD-type method. However, methods such as CVD, MBE, GSMBE, MOMBE, ALE, HYPE, ALD (Atomic Layer Deposition), evaporation, or reactive cathode sputtering may be used, as well as any deposition type providing a textured layer. When layer 60 is made of aluminum nitride, layer 60 should be substantially textured and have a preferred polarity. The texturing of layer 60 may be obtained by an additional treatment carried out after the deposition of layer 60. It for example is an anneal under an ammonia flow (NH$_3$). Layer 60 is P-type doped. Substrate 14 is N-type doped at least at the level of a region in contact with layer 60. Preferably, substrate 14 is entirely N-type doped.

Figure 8B:
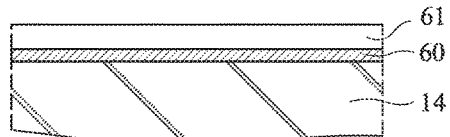

(2) Depositing a layer 61 of a dielectric material on layer 60 (FIG. 8B). Layer 61 is made of a dielectric material which may be etched selectively over the material forming layer 60. The dielectric material is, for example, silicon nitride (for example, Si$_3$N$_4$). Dielectric layer 61 for example has a thickness in the range from 50 to 200 nm, for example, approximately 100 nm.

Figure 8C:
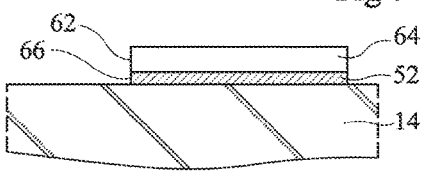

3) Etching openings 62 in dielectric layer 61 to form portions 64, or blocks, of dielectric layer 61 and expose areas of layer 60 and etching opening 66 in layer 60 above the exposed portions of layer 60 to form islands 52 (FIG. 8C). The etching of openings 62 may be carried out by a step of selective etching which causes no etching of layer 60. It may be an etching using a sulfur hexafluoride plasma (SF$_6$). The etching of openings 66 may correspond to a dry or wet etching stopping on substrate 14. As a variation, the etching of openings 66 may be a reactive ion etching or RIE, an inductively-coupled plasma or ICP etching, or a wet etching.

Figure 8D:
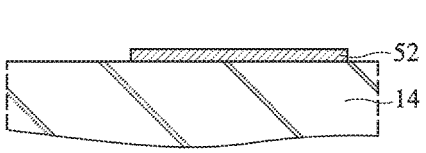

(4) Removing portions 64 (FIG. 8D). The removal of portions 64 of the dielectric layer may be carried out by a selective etch step which causes no etching of islands 52 and of substrate 14. It may be an etching using a sulfur hexafluoride plasma (SF$_6$) or a chlorinated plasma, or a BOE-type (Buffered Oxide Etch) wet etching using a mixture of ammonium fluoride (NH$_4$F) and of hydrofluoric acid (HF).

(5) Depositing dielectric layer 22 on islands 52 and on substrate 14 (FIG. 8E). This preferably is a conformal or substantially conformal deposition. Layer 22 is made of a dielectric material which may be etched selectively over the material forming islands 52 and substrate 14. Layer 22 is for example made of silicon nitride (for example, Si$_3$N$_4$), of silicon oxide (SiO$_2$), or of a silicide of the materials previously described for the forming of seed islands 18. Layer 22 has, for example, a thickness greater by at least 5 nm than the thickness of seed islands 18.

(6) Etching openings 23 in layer 22 to expose a portion of tops 20 of islands 52 (FIG. 8F). This etching is selective over the material forming seed islands 52. It for example is an ion etching or a reactive ion etching.

(7) Growing passivated portion 26 of each wire 24 up to height $H_2$ (FIG. 8G). Each wire 24 grows from surface 20 at the top of a seed island 52. Lower portion 26 of each wire 24 may be obtained by a MOCVD-type method. However, methods such as CVD, MBE, GSMBE, MOMBE, PAMBE, ALE, HVPE, or electrochemical methods may be used.

As an example, in the case where upper portion 26 is made of heavily-doped N-type GaN, a MOCVD-type method may be implemented by injection into a MOCVD reactor, of shower type, of a gallium precursor gas, for example, trimethylgallium (TMGa) and a nitrogen precursor gas, for example, ammonia ($NH_3$). As an example, a showerhead-type 3×2" MOCVD reactor commercialized by AIX-TRON, may be used. A molecular flow ratio between trimethylgallium and ammonia within the 5-200 range, preferably within the 10-100 range, enables to favor the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

The presence of silane among the precursor gases results in an incorporation of silicon within the GaN compound. A lower N-type doped portion 26 is thus obtained. This further translates as the forming of silicon nitride layer 29 which covers the periphery of portion 26 of height $H_2$, except for the top, as portion 26 grows.

(8) Growing upper portion 28 of height $H_3$ of each wire 24 (FIG. 8H) on the top of lower portion 26. For the growth of upper portion 28, the previously-described MOCVD reactor operating conditions are, as an example, maintained but for the fact that the silane flow in the reactor is decreased, for example, by a factor greater than or equal to 10, or stopped. Even when the silane flow is stopped, upper portion 28 may be N-type doped due to the diffusion in this active portion of dopants originating from the adjacent passivated portions or due to the residual doping of GaN.

The method comprises the additional steps of:

(9) Forming, for each wire 24, active layer 30 by epitaxy. Given the presence of passivating portion 29 covering the periphery of lower portion 26, the deposition of active layer 30 only occurs on the upper portion 28 of wire 24;

(10) Forming by epitaxy, for each wire 24, electron barrier layer 40 and semiconductor layer 42 on active layer 30; and

(11) Forming electrodes 38 and 12.

The manufacturing method further comprises steps of forming conductive pad 56, which may be provided before the steps of forming wire 24 or after these.

FIG. 9 is a partial simplified cross-section view of another embodiment of an optoelectronic device 70 which is capable of emitting an electromagnetic radiation. Device 70 differs from device 50 particularly by the shape of the active portion of each wire 24. Indeed, for each wire 24, active portion 72 only covers the top of wire 24. Active portion 72 may have the same composition as previously-described active layer 30. Further, a stack of semiconductor portions 74 covers active portion 72. The stack of semiconductor layers 74 may have the same composition as previously-described stack 32. An insulating portion 76 covers substrate 14 substantially all the way to the top of semiconductor portions 74. An electrode 78, which may have the same composition as previously-described electrode 38, covers insulating portion 76 and comes into contact with the layer at the top of the stack of semiconductor layers 74.

Specific embodiments of the present invention have been described. Various alterations and modifications will occur to those skilled in the art. In particular, although the drawings show embodiments where the wires, covered with a first electrode, are formed on a first surface of a support while a second electrode is formed on a second surface of the support, opposite to the first surface, it should be clear that the second electrode may be provided on the side of the first surface.

Further, although, in the previously-described embodiments, each wire 24 comprises a passivated portion 26 at the base of the wire in contact with top 20 of a seed island 18, passivated portion 26 may be absent.

Further, although embodiments have been described for an optoelectronic device comprising seed islands covering a substrate, it should be clear that the optoelectronic device may comprise a seed layer covering the substrate, the seed layer being itself covered with an insulating layer for which openings are provided to expose portions of the seed layer, the wires growing in the openings. In this case, the seed layer forms a base common to all the bipolar transistors provided in series with the light-emitting diodes.

The invention claimed is:

1. An optoelectronic device comprising:
a doped semiconductor substrate of a first conductivity type;
seed pads, on a surface of the doped semiconductor substrate, having a doping of a second conductivity type opposite to the first conductivity type;
an insulating layer extending between the seed pads on the surface of the doped semiconductor substrate, the insulating layer partially covering each of the seed pads and having openings, each of the openings exposing a portion of each of the seed pads, wherein the insulating layer partially covers a top surface of each of the seed pads and wherein the seed pads are on and contacting the surface of the doped semiconductor substrate;
wire-shaped, conical, or tapered semiconductor elements, having a doping of the first conductivity type, each wire-shaped, conical, or tapered semiconductor element resting on one of the seed pads;
light-emitting semiconductor portions, each light-emitting semiconductor portion at least partially covering one of the wire-shaped, conical, or tapered semiconductor elements; and
a circuit for biasing the seed pads,
wherein the doped semiconductor substrate is made of a semiconductor material selected from a group comprising silicon, germanium, silicon carbide, a III-V compound, a II-VI compound, and a combination of these compounds, and wherein the seed pads are made of a material selected from a group comprising aluminum nitride, boron nitride, silicon carbide, magnesium nitride, magnesium gallium nitride, or a combination thereof and of their nitrided compounds.

2. The optoelectronic device of claim 1, further comprising a circuit for biasing the light-emitting semiconductor portions.

3. The optoelectronic device of claim 1, wherein a dopant concentration of the seed pads is in a range from $10^{15}$ atoms/cm$^3$ to $10^{19}$ atoms/cm$^3$.

4. The optoelectronic device of claim 1, wherein a dopant concentration of the doped semiconductor substrate is in a range from $10^{16}$ atoms/cm$^3$ to $10^{21}$ atoms/cm$^3$.

5. The optoelectronic device of claim 1, wherein a dopant concentration of each wire-shaped, conical, or tapered semiconductor element is in a range from $10^{16}$ atoms/cm$^3$ to $10^{21}$ atoms/cm$^3$.

6. The optoelectronic device of claim 1, wherein a thickness of each seed pad is in a range from 1 nm to 1 µm.

7. The optoelectronic device of claim 1, wherein the doped semiconductor substrate is made of single-crystal silicon.

8. The optoelectronic device of claim 1, wherein each wire-shaped, conical, or tapered semiconductor element mainly comprises a semiconductor material selected from a group comprising a III-V compound, a II-VI compound, and a combination of these compounds.

9. The optoelectronic device of claim 1, wherein each wire-shaped, conical, or tapered semiconductor element is a microwire or a nanowire.

10. A method of manufacturing an optoelectronic device, comprising the successive steps of:

providing a doped semiconductor substrate of a first conductivity type;

forming, on a surface of the doped semiconductor substrate, seed pads, having a doping of a second conductivity type opposite to the first conductivity type;

forming an insulating layer extending between the seed pads on the surface of the doped semiconductor substrate, the insulating layer partially covering each of the seed pads and having openings, each of the openings exposing a portion of each of the seed pads, wherein the insulating layer partially covers a top surface of each of the seed pads and wherein the seed pads are on and contacting the surface of the doped semiconductor substrate;

forming wire-shaped, conical, or tapered semiconductor elements, having a doping of the first conductivity type, each wire-shaped, conical, or tapered semiconductor element resting on one of the seed pads;

forming light-emitting semiconductor portions, each light-emitting semiconductor portion at least partially covering one of the wire-shaped, conical, or tapered semiconductor elements; and providing a circuit for biasing the seed pads, wherein the doped semiconductor substrate is made of a semiconductor material selected from a group comprising silicon, germanium, silicon carbide, a III-V compound, a II-VI compound, and a combination of these compounds and wherein the seed pads are made of a material selected from a group comprising aluminum nitride, boron nitride, silicon carbide, magnesium nitride, magnesium gallium nitride, or a combination thereof and of their nitrided compounds.

\* \* \* \* \*